United States Patent [19]

Cleeves

[11] Patent Number: 4,806,504

[45] Date of Patent: Feb. 21, 1989

[54] PLANARIZATION METHOD

[75] Inventor: James M. Cleeves, Redwood City, Calif.

[73] Assignee: Fairchild Semiconductor Corporation, Cupertino, Calif.

[21] Appl. No.: 906,344

[22] Filed: Sep. 11, 1986

[51] Int. Cl.$^4$ .......................... B05D 5/12; B05D 2/12
[52] U.S. Cl. ..................... 437/228; 437/231; 427/240; 427/401
[58] Field of Search ................. 427/240, 82, 401, 384; 156/653, 657; 437/228, 231

[56] References Cited

U.S. PATENT DOCUMENTS

| | | | |
|---|---|---|---|
| 3,730,760 | 5/1973 | Machmiller | 427/240 |
| 4,271,209 | 6/1981 | DePalma et al. | 427/240 |
| 4,515,828 | 5/1985 | Economy et al. | 422/240 |

*Primary Examiner*—Janyce Bell
*Attorney, Agent, or Firm*—Lee Patch; James M. Heslin; Vernon A. Norviel

[57] ABSTRACT

A liquid polymeric resin is applied over an irregular surface of a semiconductor substrate by first spinning followed by rotation of the substrate about an axis parallel to and spaced-apart from the plane of the substrate. Such a technique provides for planarization layer having enhanced planarity. When applied over an underlying insulating layer, the planarization layer will typically be etched back in order to planarize the insulating layer. Alternatively, the planarization layer may be formed directly over the semiconductor substrate, and an insulating layer formed over the planarization layer. In either case, the substrates are then ready for subsequent processing according to well known techniques, typically the formation of metallization layers over the insulating layer.

11 Claims, 2 Drawing Sheets

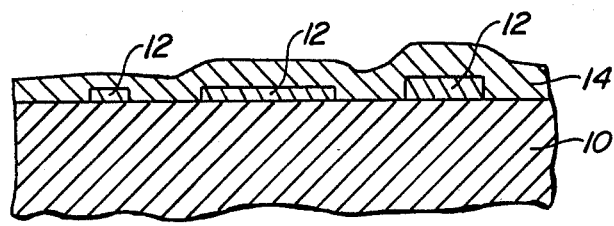
FIG._1.
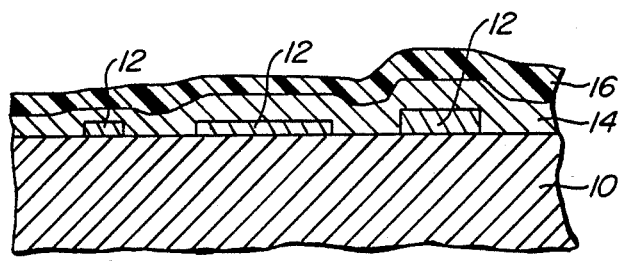
FIG._2.
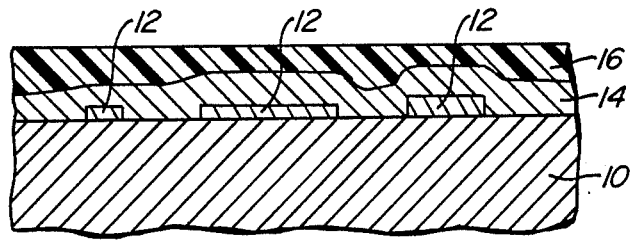
FIG._3.
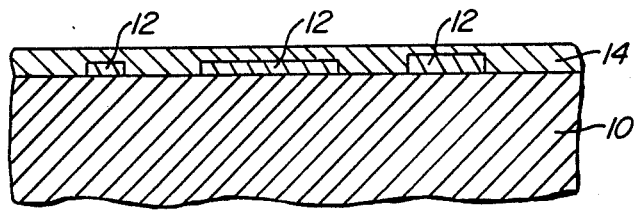
FIG._4.

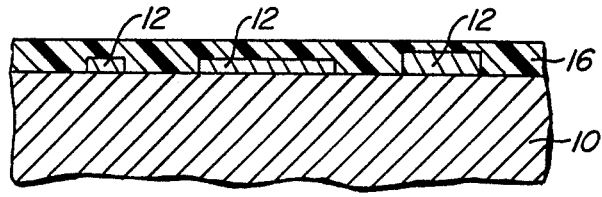
FIG._5.
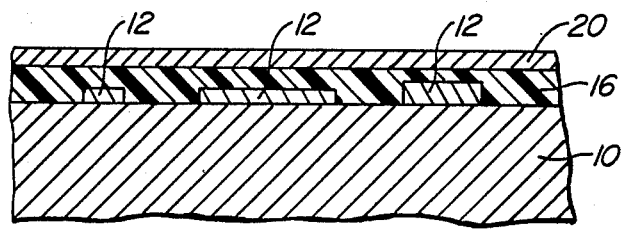
FIG._6.
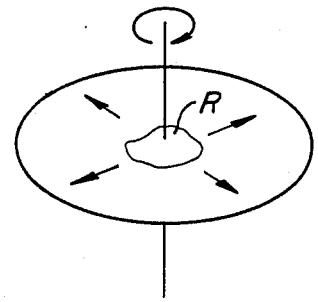
FIG._7.
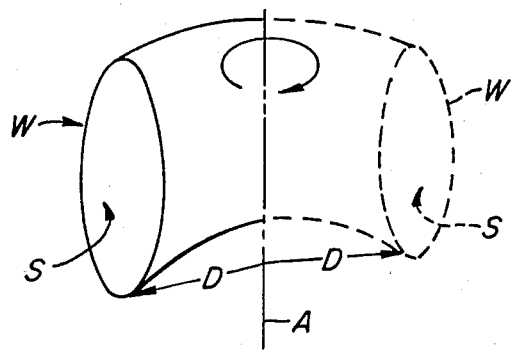
FIG._8.

PLANARIZATION METHOD

BACKGROUND OF THE INVENTION

1. Field of the Invention

The present invention relates generally to semiconductor wafer fabrication, and more particularly to a method for planarizing insulating and other layers formed over such substrates.

Planarization of semiconductor substrate surfaces during fabrication of fine-geometry integrated circuits is necessary to improve both photolithographic feature resolution and dimensional control, and to alleviate metallization discontinuity which may result from abrupt changes in topography.

Two commonly employed methods for planarization involve the deposition of a sacrificial leveling layer, such as a photoresist, to fill the voids and crevices which are present following application of an insulating layer. The flat surface created by the combined sacrificial and insulating layers is etched back at a uniform rate to leave a generally flat layer of insulating material having a desired thickness. The first of these methods employs ion beam erosion of the sacrificial and insulating layers which, although workable, is a relatively slow technique capable of removing only about 1000 Å per minute. The second technique utilizes conventional high frequency, low pressure plasma etching for removing the sacrificial layer. While such plasma etching is somewhat more rapid than ion beam erosion, it still takes a long time to etch relatively thick planarization layers, which may have thicknesses in the range from 2 to 5 $\mu$m.

Such thick planarization layers are required in order to adequately cover underlying irregularities and provide for a level surface from which to start the etch back process. The planarization materials, which are typically applied by spin-on techniques, are relatively viscous and will propagate the underlying surface topology, at least in part. This is particularly true when relatively thin layers are utilized, which tend to spread much more thinly over relatively narrow features than over relatively wide features. Thus, in order to enhance the planarity of the planarization layers, relatively thick layers have been utilized in the past.

For the above reasons, it would be desirable to provide improved methods for planarizing substrate surfaces, particularly to provide for improved techniques for applying relatively thin planarization layers which display enhanced surface planarity. The use of relatively thin planarization layers decreases the processing time required for etching back such layers, and the enhanced planarity improves both photolithographic feature resolution and dimensional control, and decreases the likelihood of metallization discontinuities which may result from lack of planarity.

2. Description of the Background Art

Planarization techniques employing ion beam erosion of sacrificial and insulating layers are described in Johnson et al. (1982) Appl. Phy. Lett. 40:636; Johnson et al. (1983) J. Vac. Sci. Technol. B1:487; and Mogami et al. (1985) J. Vac. Sci. Technol. B3:857. Methods for planarization using a plasma etch of a sacrificial layer are described in Adams and Capio (1981) J. Electrochem. Soc. 128:423. See also, U.S. Pat. Nos. 4,358,356 and 4,377,438 which discuss alternate planarization techniques.

SUMMARY OF THE INVENTION

The present invention provides a method for forming relatively thin planarization layers having enhanced planarity on semiconductor substrates. By reducing the thickness of the planarization layer, the time required for etching back such layers can be significantly reduced. Moreover, the improved planarity results in better photolithographic feature resolution and dimensional control, as well as reduced likelihood of metallization failure which can result from variations in the underlying topography.

The present invention relies on initial application of a liquid polymeric resin by conventional spin-on techniques. A preselected quantity of the resin is placed near the center of the wafer, and the wafer rotated about its central axis normal to the plane of the wafer in order to spread the resin laterally across the surface of the wafer. While such spinning provides an initial leveling of the liquid resin, the leveling is not complete. In particular, when the underlying substrate displays features which vary greatly in height or width, the spun-on resin can deviate substantially from planarity, usually deviating at least ±20% based on the average thickness of the resin, frequently deviating ±50% or more.

The present invention provides for enhanced leveling of the liquid resin by subjecting the wafer to a second rotation about an axis parallel to the plane of the wafer and spaced apart from the surface which is being planarized. Such rotation provides a leveling force normal to the surface of the wafer, resulting in a highly uniform surface with variations in planarity usually less than about ±10% of the average thickness of the resin, frequently being less than about ±5%. Moreover, as the effect of the surface irregularities of the wafer on the planarity of the resin are diminished, the ultimate thickness of the resin can be greatly reduced. Indeed, by properly selecting the amount of resin initially applied to the wafer, a final thickness just slightly over the highest feature height may be achieved. Such reduction in thickness greatly reduces the processing time required when the resulting planarization layer is etched back.

Normally, the planarization layer of the present invention will be formed over an insulating layer, and the combined planarization and insulating layers will be etched back at a uniform rate to provide a planarized insulating layer. By uniform rate, it is meant that the etch rates for the planarizing layer and the insulating layer are substantially identical so that the flat surface is retained even after the interface between the two layers is reached. The planarization layer of the present invention, however, may also be used for direct application over metallization or other layers, where a thin insulating layer may be applied directly over the planarization layer. The insulating layer will have a very flat surface by virtue of the planarity of the underlying planarization layer.

BRIEF DESCRIPTION OF THE DRAWINGS

FIG. 1 is a detailed cross-sectional view of a portion of a semiconductor substrate having an insulating layer formed over irregular topographic features on the surface of the substrate.

FIG. 2 illustrates the structure of FIG. 1, further including a liquid polymeric resin applied over the insulating layer by spin-on techniques.

FIG. 3 illustrates the structure of FIG. 2, after the liquid polymeric resin has been leveled by the method of the present invention.

FIG. 4 illustrates the structure of FIG. 3, after the cured resin layer and insulating layer have been planarized by etch back techniques.

FIG. 5 is a detailed cross-sectional view of a portion of a semiconductor substrate having a liquid polymeric resin applied directly over the irregular topographic features on the surface of the substrate.

FIG. 6 illustrates the structure of FIG. 5, after the liquid polymeric resin has been leveled by the method of the present invention, and an insulating layer has been formed over the leveled polymeric material.

FIG. 7 is a schematic diagram illustrating the spin-on technique for initially applying the liquid polymeric resin.

FIG. 8 is a schematic diagram illustrating the subsequent rotation step employed by the present invention for leveling the liquid polymeric resin.

DESCRIPTION OF THE PREFERRED EMBODIMENTS

Referring generally to FIGS. 1-6, specific methods will be described for fabricating semiconductor devices according to the method of the present invention. Semiconductor devices are fabricated on silicon wafer substrates 10, with a portion of such a substrate being illustrated in cross-section in FIGS. 1-6. Usually, the substrate 10 will include a variety of topographic features 12 formed on its upper surface. Such features may result from a variety of processing steps, including metallization, oxide formation, etching processing, deposition processes, and the like, and the features may vary in height and/or width.

Referring now in particular to FIG. 1, an insulating layer 14 is formed over the upper surface of the substrate 10, by conventional techniques. Typically, silicon dioxide and silicon nitride insulating layers will be applied by chemical vapor deposition (CVD), although in some cases thermal oxidation may also find use. As can be seen in FIG. 1, the upper surface of the insulating layer 14 will conform at least in part to the underlying topography of the substrate 12, resulting in a highly non-planar surface.

To planarize the insulating layer 14, a liquid polymeric resin 16 (FIG. 2) is applied over the insulating layer by spinning according to well known techniques. The substrate wafer, which is a disc having a diameter in the range from about 3 to 5 inches, is placed in an apparatus capable of spinning the wafer about its central, normal axis at a speed in the range from about 1000 to 6000 rpm. A preselected amount of the liquid resin R is placed at the center of the wafer W, and the wafer spun to laterally spread the resin, as illustrated in FIG. 7. Although the spinning provides a certain measure of leveling, the upper surface of the resin layer 16 conforms to the underlying surface irregularities in the insulating layer 14, resulting in an uneven surface 16, as illustrated.

According to the present invention, the structure shown in FIG. 2 is next subjected to rotation about an axis parallel to and spaced-apart from the plane of the wafer, as illustrated in FIG. 8. By facing the surface S of the wafer W toward rotational axis A at all times, a leveling force normal to the surface of the wafer is provided. The speed of rotation is selected to provide a desired degree of leveling, with higher speeds and larger rotational diameters providing greater leveling force. The rotational speed is typically in the range from about 100 to 2000 rpm, with a rotational diameter D in the range about 20 to 60 cm. Such rotation provides for a normal leveling force in the range from about 5 to 100 g. The normal leveling force results in leveling of the polymeric resin 16, as illustrated in FIG. 3.

Conveniently, the wafer is heated to a temperature in the range from about 150 to 200° C. during the rotation just described. Such heating initially decreases the viscosity, facilitating the leveling operation just described. Over time, however, the heating acts to cure the polymeric resin, typically by cross-linking. Alternatively, the curing can be accomplished by heating after the leveling rotation has been completed.

After curing, the structure illustrated in FIG. 3 is subjected to an etch back process according to well known techniques. Typically, the wafer is placed in a parallel plate plasma reactor, and subjected to etching under conditions which assure equal etch rate for the planarization material as well as the underlying insulating material. After the etch back is complete, the structure appears as in FIG. 4 with a substantially flat upper surface on the insulating layer 14. The structure is now ready for application of subsequent metallization or other layers, according to well known principles.

Suitable polymeric resins for use in forming the planarization layer will be thermally stable and amenable to etching, particularly plasma etching which will be used to etch back the planarization layer. A variety of resins may be used, including organic resins and inorganic polymeric resins. Suitable organic polymeric resins include photoresists, polyimides, silicones, polymethacrylates, and the like, while suitable inorganic polymeric resins include polysiloxanes. After application, the liquid resins will be cured by baking at elevated temperatures, typically in the range from about 90 to 200° C. for photoresists, for a time sufficient to fully cure the resin, typically on the order of about 1 hour. Alternatively, the resins may be cured by exposure to a radiant heat source for a shorter period of time, typically 2 to 3 minutes.

Referring now to FIGS. 5 and 6, an alternative embodiment of the method of the present invention will be described. In the alternative embodiment, the liquid polymeric resin layer 16 is applied directly over the upper surface of the substrate 10, by the spin-on techniques just described. The wafer is then rotated, as described in connection with FIG. 8, resulting in a highly planar surface in layer 16. After curing, the planarization layer 16 may be partially etched back, typically in order to reveal alignment features, or may be utilized without further processing. As illustrated in FIG. 6, an insulating layer 20 may then be formed over the planarization layer 16. As the planarization layer is itself highly uniform and free from irregularities, the insulating layer 20 will conform and also be substantially planar and free from irregularities. The structure of FIG. 6 is also ready for further processing according to conventional techniques, typically formation of a metallization layer thereon.

Although the foregoing invention has been described in some detail by way of illustration and example for purposes of clarity of understanding, it will be obvious that certain changes and modifications may be practiced within the scope of the appended claims.

What is claimed is:

1. A method for applying a planarization layer to a planar silicon semiconductor wafer substrate having an irregular surface, said method comprising:
- applying a liquid resin to the surface of the substrate in an amount sufficient to cover all irregularities said liquid resin being selected from the group consisting of photoresists, polyimides, silicones, polymethacrylates, and polysiloxanes;
- spinning the substrate about an axis normal to the plane of the substrate to spread the resin over the surface; and
- rotating the substrate about an axis parallel to and spaced-apart from the plane with the surface facing the axis, so that the liquid resin is leveled, forming the planarization layer.

2. A method as in claim 1, wherein the resin is heated to a temperature in the range from about 150 to 200° C. while the substrate is being rotated.

3. A method as in claim 1, wherein the substrate is spun at from about 100 to 2000 rpm.

4. A method as in claim 1, wherein the substrate is rotated under conditions which result in a force normal to the surface of the substrate in the range from about 5 to 100 g.

5. A method as in claim 1, wherein the liquid resin is a polysiloxane.

6. A method as in claim 1, further comprising the step of forming an inorganic dielectric layer over the planarization layer.

7. A method as in claim 1, further comprising the step of etching back the planarization layer.

8. A method for planarizing a semiconductor substrate having an irregular surface, said method comprising:
- forming a dielectric layer over the irregular surface, wherein the surface of the dielectric layer conforms at least in part to the surface of the substrate;
- applying a liquid resin to the surface of the dielectric layer in an amount sufficient to cover all irregularities present in the dielectric layer, said liquid resin being selected from the group consisting of photoresists, polyimides, silicones, polymethacrylates, and polysiloxanes;
- spinning the substrate about an axis normal to the plane of the substrate to spread the resin over the surface;
- rotating the substrate about an axis parallel to and spaced-apart from the plane of the wafer with its surface facing the axis, so that the liquid resin is leveled by the resulting force to the surface;
- curing the liquid resin to form a sacrificial planarization layer; and
- etch back the planarization layer and dielectric layer under conditions such that the etch rates of the two layers are substantially equal, whereby the dielectric layer is planarized.

9. A method as in claim 8, wherein the dielectric layer is silicon oxide or silicon nitride.

10. A method as in claim 8, wherein the liquid resin is a polysiloxane.

11. A method as in claim 8, wherein the liquid resin is a photoresist, and the substrate is heated to a temperature in the range from 150 to 200° C. while being spun.

* * * * *